US012614702B2

(12) United States Patent
Park et al.

(10) Patent No.: US 12,614,702 B2
(45) Date of Patent: Apr. 28, 2026

(54) SUBSTRATE PROCESSING APPARATUS AND A METHOD OF PROCESSING A SUBSTRATE USING THE SAME

(71) Applicant: SAMSUNG ELECTRONICS CO., LTD., Suwon-si (KR)

(72) Inventors: Changbae Park, Suwon-si (KR); Ki-Il Kim, Suwon-si (KR); Jongchul Park, Suwon-si (KR); Jae Sik An, Suwon-si (KR); Suntaek Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 56 days.

(21) Appl. No.: 18/628,334

(22) Filed: Apr. 5, 2024

(65) Prior Publication Data

US 2025/0104980 A1     Mar. 27, 2025

(30) Foreign Application Priority Data

Sep. 26, 2023     (KR) ........................ 10-2023-0129157

(51) Int. Cl.
H01J 37/32     (2006.01)

(52) U.S. Cl.
CPC ... H01J 37/32669 (2013.01); H01J 2237/024 (2013.01); H01J 2237/041 (2013.01); H01J 2237/327 (2013.01); H01J 2237/3341 (2013.01)

(58) Field of Classification Search
None
See application file for complete search history.

(56) References Cited

U.S. PATENT DOCUMENTS

| | | | | |
|---|---|---|---|---|
| 5,425,844 | A * | 6/1995 | Hirata .............. | G06K 19/06196 216/22 |
| 6,831,742 | B1 | 12/2004 | Sui et al. | |
| 6,930,047 | B2 | 8/2005 | Yamazaki et al. | |
| 9,165,780 | B2 * | 10/2015 | Shimizu ............ | H01L 21/02164 |
| 9,222,842 | B2 * | 12/2015 | Sun .......................... | G01K 1/12 |
| 9,362,090 | B2 * | 6/2016 | Honda .............. | H01J 37/32862 |
| 9,761,458 | B2 * | 9/2017 | Roozeboom ...... | H01J 37/32623 |
| 10,410,889 | B2 * | 9/2019 | Sadjadi ............ | H01L 21/67069 |
| 11,557,466 | B2 * | 1/2023 | Gottheim .............. | C23C 16/509 |
| 11,815,410 | B2 * | 11/2023 | Brown ..................... | G01K 7/18 |

(Continued)

FOREIGN PATENT DOCUMENTS

| | | |
|---|---|---|
| JP | 11-340202 A | 12/1999 |
| JP | 3888538 B2 | 3/2007 |
| WO | WO-0169655 A2 * | 9/2001 ........... H10D 48/385 |

OTHER PUBLICATIONS

Wang et al., "72 nm Pitch Hexagonal MTJ Array on DRAM Platform for High-Density MRAM", IEEE Transactions on Magnetics, Nov. 11, 2021, 6 total pages, vol. 57, doi:10.1109/TMAG.2021.3115602.

(Continued)

*Primary Examiner* — Srinivas Sathiraju
(74) *Attorney, Agent, or Firm* — Sughrue Mion, PLLC

(57)     ABSTRACT

A substrate processing apparatus includes a process chamber providing a process space, a stage configured to support a substrate, a gas injection unit spaced upward from the stage in the process space, and a spin polarizer having a ring shape and spaced upward from the stage. The spin polarizer (Continued)

includes a polarizer body having a ring shape, and a thin layer on a surface of the polarizer body. The thin layer includes a ferromagnetic material.

16 Claims, 6 Drawing Sheets

(56) References Cited

U.S. PATENT DOCUMENTS

| | | | |
|---|---|---|---|
| 2003/0164509 A1* | 9/2003 | Gregg | H10D 48/385 |
| | | | 257/197 |
| 2014/0192840 A1* | 7/2014 | Sun | G01K 1/12 |
| | | | 374/208 |
| 2015/0116870 A1* | 4/2015 | Singleton | G11B 5/3912 |
| | | | 360/320 |
| 2016/0027667 A1* | 1/2016 | Sadjadi | H01J 37/3244 |
| | | | 438/798 |
| 2020/0144028 A1* | 5/2020 | Nagami | H01J 37/32577 |
| 2020/0176226 A1* | 6/2020 | Tsukahara | H01J 37/32568 |
| 2021/0074520 A1* | 3/2021 | Shihommatsu | H01J 37/32642 |
| 2022/0165552 A1* | 5/2022 | Kim | H01J 37/3266 |
| 2022/0216039 A1* | 7/2022 | Jeang | H01J 37/32238 |
| 2022/0305536 A1* | 9/2022 | Lee | H01L 21/67028 |
| 2023/0187184 A1* | 6/2023 | Ishikawa | H01J 37/32715 |
| | | | 216/67 |
| 2024/0038505 A1* | 2/2024 | Na | H01J 37/20 |
| 2024/0038506 A1* | 2/2024 | Lane | H01J 37/32669 |
| 2024/0062991 A1* | 2/2024 | Koshimizu | H01J 37/32715 |
| 2024/0302164 A1* | 9/2024 | Yang | G03F 7/706849 |
| 2024/0395509 A1* | 11/2024 | Koshimizu | H01J 37/32724 |

OTHER PUBLICATIONS

Ikeda et al., "A perpendicular-anisotropy CoFeB—MgO magnetic tunnel junction", Nature Materials, Jul. 11, 2010, pp. 721-724, vol. 9, doi:10.1038/NMAT2804.

Saravanan et al., "Effect of thickness on tuning the perpendicular coercivity of Ta/CoFeB/Ta trilayer", Journal of Materials Science Materials in Electronics (2018), Oct. 14, 2017, pp. 336-342, doi:10.1007/s10854-017-7921-3.

Kim et al., "Investigation of a Plasma Sheath in a Weakly Magnetized ICP Using Laser-Induced Fluorescence Technique", IEEE Transactions on Plasma Science, Mar. 7, 2013, pp. 559-563, vol. 41, doi:10.1109/TPS.2012.2237184.

Yamamura et al., "Energy Dependence of Ion-Induced Sputtering Yields From Monatomic Solids at Normal Incidence", Atomic and Nuclear Data Tables, Mar. 1996, pp. 149-253, vol. 62.

Yamamura et al., "An Empirical Formula for Angular Dependence of Sputtering Yields", Radiation Effects, 1984, pp. 57-72, vol. 80.

* cited by examiner

SUBSTRATE PROCESSING APPARATUS AND A METHOD OF PROCESSING A SUBSTRATE USING THE SAME

CROSS-REFERENCE TO RELATED APPLICATIONS

This application claims benefit of priority under 35 U.S.C. § 119 to Korean Patent Application No. 10-2023-0129157, filed on Sep. 26, 2023, in the Korean Intellectual Property Office, the disclosure of which is incorporated by reference herein in its entirety.

BACKGROUND

1. Field

The present disclosure relates generally to a substrate processing apparatus and a method of processing a substrate using the same, and more particularly, to a substrate processing apparatus capable of aligning spin directions of plasma particles passed through a spin polarizer and a method of processing a substrate using the same.

2. Description of Related Art

A semiconductor device may be manufactured through various processes. For example, a semiconductor manufacturing process of selectively removing an unnecessary portion on a substrate by using a liquid or gas etchant may be referred to as an etching process. Examples of etching processes may include, but not be limited to, a dry etching process and a wet etching process. A dry etching process may refer to a process of removing a specific portion of a substrate by using a reactive gas and/or ions. A wet etching process may refer to a process of etching a specific portion of a substrate by a chemical reaction using a solution.

The dry etching process may be performed using plasma. However, when using plasma, a ratio of ions may become higher than a ratio of electrons from a central portion toward an edge portion of a substrate and/or toward an electrode or a wall of a process chamber, thereby generating a sheath area in which an electric potential may decrease relatively rapidly. In addition, a density of plasma in the sheath area may not be uniform, and thus, flatness of a substrate that may be etched using plasma may be deteriorated.

SUMMARY

One or more example embodiments of the present disclosure provide a substrate processing apparatus capable of consistently aligning spin directions of plasma particles on an edge of a substrate and a method of processing a substrate using the same.

Further, one or more example embodiments of the present disclosure provide a substrate processing apparatus capable of changing spin directions of plasma particles on an edge of a substrate and a method of processing a substrate using the same.

Further, one or more example embodiments of the present disclosure provide a substrate processing apparatus capable of increasing and/or decreasing reactivity between a substrate and plasma on an edge of the substrate and a method of processing a substrate using the same.

According to an aspect of the present disclosure, a substrate processing apparatus includes a process chamber providing a process space, a stage configured to support a substrate, a gas injection unit spaced upward from the stage in the process space, and a spin polarizer having a ring shape and spaced upward from the stage. The spin polarizer includes a polarizer body having a ring shape, and a thin layer on a surface of the polarizer body. The thin layer includes a ferromagnetic material.

According to an aspect of the present disclosure, a substrate processing apparatus includes a process chamber providing a process space, a stage configured to support a substrate, a gas injection unit spaced upward from the stage in the process space, a lower radio frequency (RF) power source electrically coupled with the stage and configured to supply alternating current (AC) power to the stage, and a spin polarizer on an edge of the stage and spaced upward from the stage. The spin polarizer includes a polarizer body, and a thin layer at least partially surrounding at least one of an inner surface, a top surface, and a bottom surface of the polarizer body.

According to an aspect of the present disclosure, a method of processing a substrate includes disposing the substrate in a substrate processing apparatus, and processing the substrate. The processing of the substrate includes magnetizing a spin polarizer of the substrate processing apparatus, and generating plasma using the substrate processing apparatus. The spin polarizer is spaced upward from a stage in a lower portion of a process space provided by a process chamber of the substrate processing apparatus.

Additional aspects may be set forth in part in the description which follows and, in part, may be apparent from the description, and/or may be learned by practice of the presented embodiments.

BRIEF DESCRIPTION OF DRAWINGS

The above and other aspects, features, and advantages of certain embodiments of the present disclosure may be more apparent from the following description taken in conjunction with the accompanying drawings, in which.

DETAILED DESCRIPTION

Figure 1:
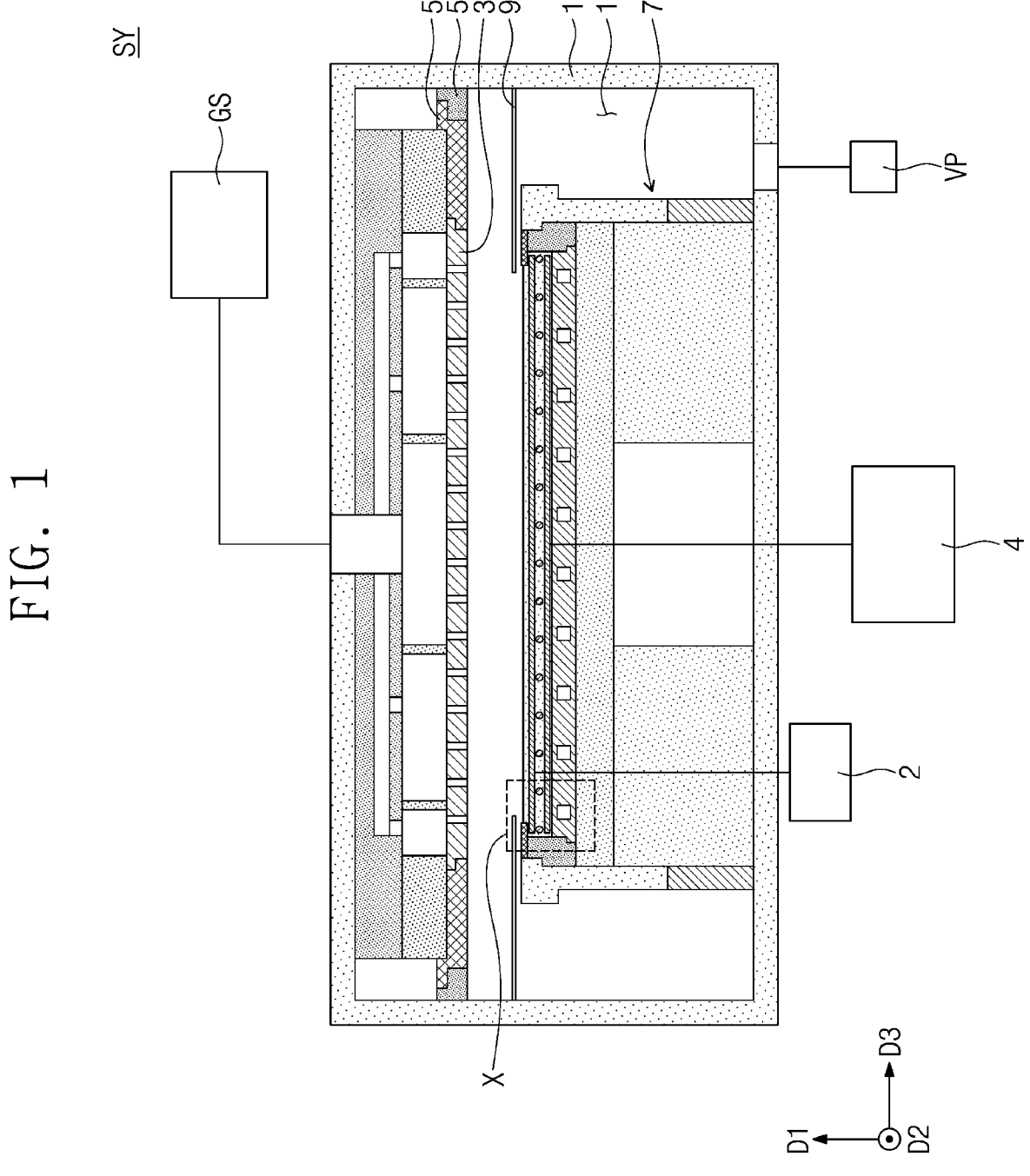
FIG. 1 is a front view illustrating a substrate processing apparatus, according to some embodiments.

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art may recognize that various changes and modifications of the embodiments described herein may be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

It is to be understood that when an element or layer is referred to as being "over," "above," "on," "below," "under," "beneath," "connected to" or "coupled to" another element or layer, it may be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

The terms "upper," "middle", "lower", and the like may be replaced with terms, such as "first," "second," third" to be used to describe relative positions of elements. The terms "first," "second," third" may be used to describe various elements but the elements are not limited by the terms and a "first element" may be referred to as a "second element". Alternatively or additionally, the terms "first", "second", "third", and the like may be used to distinguish components from each other and do not limit the present disclosure. For example, the terms "first", "second", "third", and the like may not necessarily involve an order or a numerical meaning of any form.

As used herein, when an element or layer is referred to as "surrounding" another element or layer, the element or layer may surround at least a portion of the other element or layer, where the portion may include a fraction of the other element or may include an entirety of the other element. Similarly, when an element or layer is referred to as "overlapping" another element or layer, the element or layer may cover at least a portion of the other element or layer, where the portion may include a fraction of the other element or may include an entirety of the other element.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment. The embodiments described herein are example embodiments, and thus, the disclosure is not limited thereto and may be realized in various other forms.

It is to be understood that the specific order or hierarchy of blocks in the processes/flowcharts disclosed are an illustration of exemplary approaches. Based upon design preferences, it is understood that the specific order or hierarchy of blocks in the processes/flowcharts may be rearranged. Further, some blocks may be combined or omitted. The accompanying claims present elements of the various blocks in a sample order, and are not meant to be limited to the specific order or hierarchy presented.

As used herein, each of the terms "CoFeB", "CoFe", "PtMn", "$Y_2O_3$", and the like may refer to a material made of elements included in each of the terms and is not a chemical formula representing a stoichiometric relationship.

Hereinafter, various embodiments of the present disclosure are described with reference to the accompanying drawings.

Hereinafter, a reference designator D1 may be referred to as a first direction, a reference designator D2 intersecting the first direction D1 may be referred to as a second direction, and a reference designator D3 intersecting both the first direction D1 and the second direction D2 may be referred to as a third direction. The first direction D1 may also be referred to as an upward direction, and an opposite direction to the first direction D1 may also be referred to as a downward direction. In addition, each of the second direction D2 and the third direction D3 may be referred to as a horizontal direction.

Figure 2:
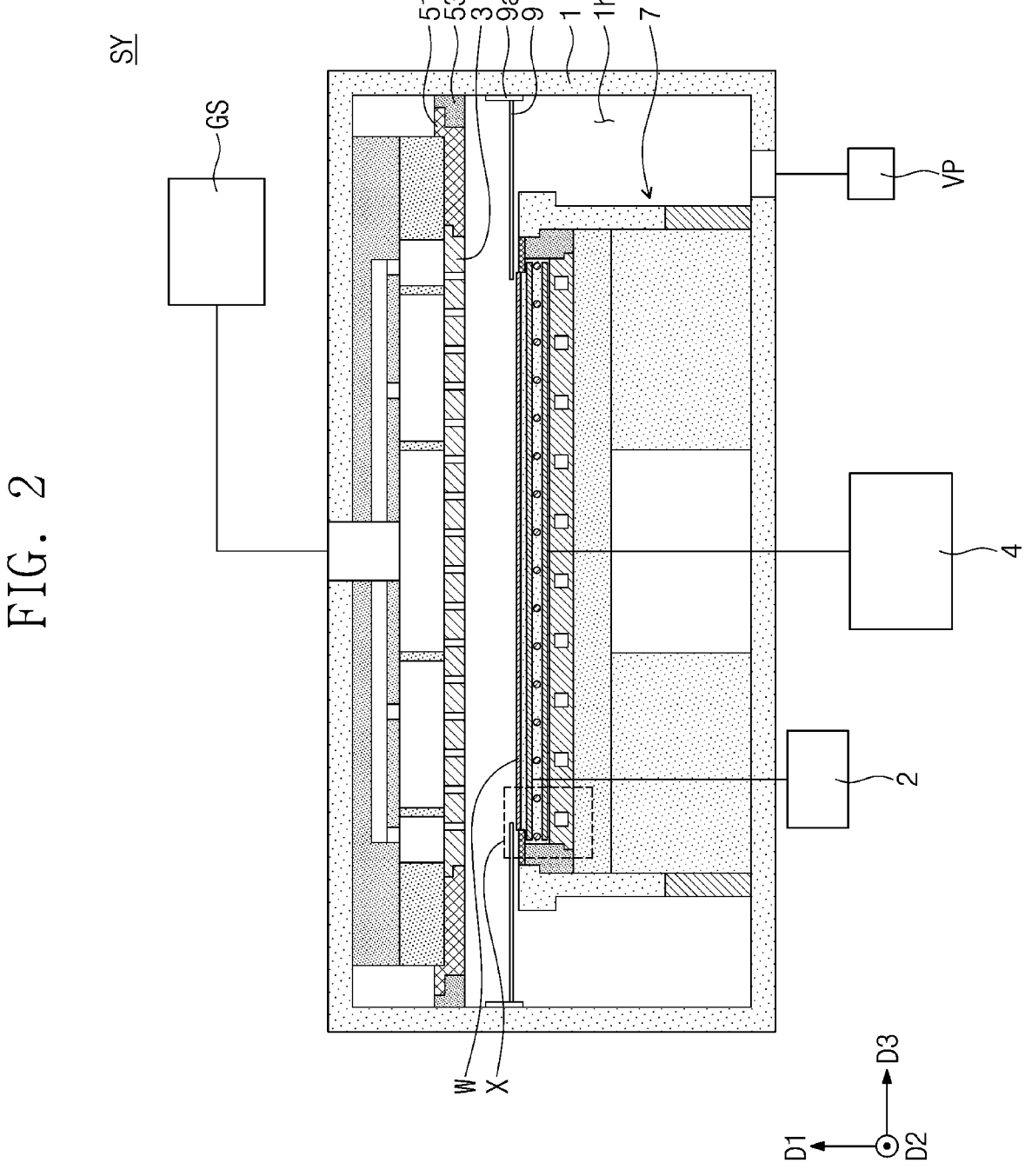
FIG. 2 is a front view illustrating a substrate processing apparatus including a driving unit, according to some embodiments.
Figure 3:
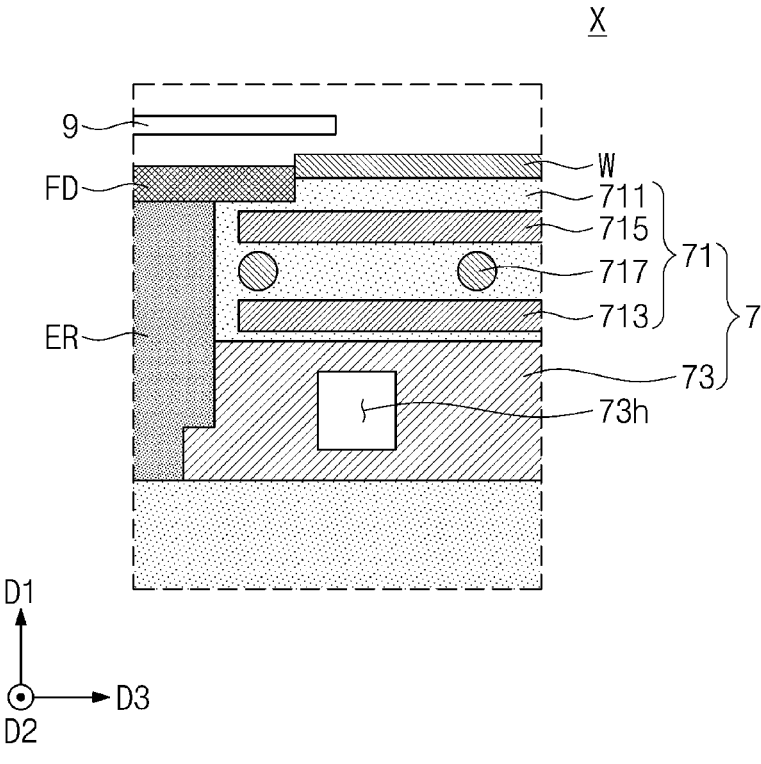
FIG. 3 is an enlarged front view illustrating a portion of a substrate processing apparatus, according to some embodiments.

FIG. 1 is a front view illustrating a substrate processing apparatus, according to some embodiments. FIG. 2 is a front view illustrating a substrate processing apparatus including a driving unit, according to some embodiments. FIG. 3 is an enlarged front view illustrating a portion of a substrate processing apparatus, according to some embodiments.

Referring to FIGS. 1 and 2, a substrate processing apparatus SY may be provided. The substrate processing apparatus SY may be and/or may include an apparatus used to perform an etching process and/or a deposition process on a substrate W. However, embodiments of the present disclosure are not limited thereto. For example, the substrate W may refer to a silicon (Si) wafer, however, embodiments of the present disclosure are not limited thereto. The substrate processing apparatus SY may be configured to process a substrate W using plasma. That is, the substrate processing apparatus SY may generate the plasma by at least one of various methods. For example, the substrate processing apparatus SY may be and/or may include a capacitively coupled plasma (CCP) apparatus and/or an inductively coupled plasma (ICP) apparatus. Hereinafter, a CCP apparatus is described as an example for ease and convenience of explanation and illustration. The substrate processing apparatus SY may include a process chamber 1, a stage 7, a gas injection unit 3, an outer ring 51, a heating liner ring 53, a DC power source 2, a lower radio frequency (RF) power source 4, a vacuum pump VP, a gas supply unit GS, and a spin polarizer 9.

The process chamber 1 may provide a process space 1h. A process may be performed on the substrate W in the process space 1h. The process space 1h may be separated from an external space (e.g., external to the process chamber 1). The process space 1h may be in a substantially vacuum state while the process is performed on the substrate W. Plasma PM (e.g., FIGS. 6 and 7) may be generated in the process space 1h. The plasma PM may include, but not be limited to, ions, electrons, radicals, and the like. The radicals may be neutral. For example, the radicals may isotropically react with the substrate W. As another example, the radicals may be in an unstable state. Alternatively or additionally, the radicals may react relatively easily with the substrate W. The ions may have charges. For example, the ions may aniso- tropically react with the substrate W by an electric field. The process space 1*h* may have a cylindrical shape. Alternatively or additionally, the process chamber 1 may have, but not limited to, a cylindrical shape.

The stage 7 may be located in the process chamber 1. That is, the stage 7 may be located in the process space 1*h*. The stage 7 may be configured to support and/or fix (e.g., hold) the substrate W. The process may be performed on the substrate W in a state in which the substrate W is placed on the stage 7.

The gas injection unit 3 may be configured to inject a gas into the process space 1*h*. For example, the gas supplied from the gas supply unit GS may be uniformly injected into the process space 1*h* through the gas injection unit 3. The gas injection unit 3 may be located in the process chamber 1. That is, the gas injection unit 3 may be located in the process space 1*h*. The gas injection unit 3 may be spaced upward from the stage 7. The gas injection unit 3 may have a shower head shape, as shown in FIG. 1. However, the shape of the gas injection unit 3 may not be limited thereto. For example, in some embodiments the gas injection unit 3 may have a nozzle shape. In optional or additional embodiments, the gas injection unit 3 may have another structural shape that may be capable of uniformly injecting the gas into the process space 1*h*.

The outer ring 51 may surround the gas injection unit 3. That is, the outer ring 51 may be disposed outside the gas injection unit 3 to surround the gas injection unit 3, when viewed in a plan view. The outer ring 51 may be in contact with the gas injection unit 3.

The heating liner ring 53 may surround the outer ring 51. That is, the heating liner ring 53 may be disposed outside the outer ring 51 to surround the outer ring 51. The heating liner ring 53 may support the outer ring 51. The heating liner ring 53 may include, but not be limited to, aluminum (Al), yttrium oxide ($Y_2O_3$), and the like. For example, the heating liner ring 53 may have a shape in which aluminum (Al) is coated with yttrium oxide ($Y_2O_3$).

The DC power source 2 may be configured to apply direct current (DC) power to the stage 7. The substrate W may be fixed and/or held at a certain position on the stage 7 by the DC power applied from the DC power source 2.

The lower RF power source 4 may be configured to supply alternating current (AC) power to the stage 7. The lower RF power source 4 may be electrically connected to (e.g., coupled) the stage 7. The lower RF power source 4 may be configured to supply RF power to the stage 7. The RF power may have a RF current. The RF current may be an alternating current. A frequency of the RF current may range from about 12 megahertz (MHz) to about 14 MHz. For example, the frequency of the RF current may be about 13.56 MHz. The plasma in the process space 1*h* may be controlled by the lower RF power source 4. That is, a concentration and/or a pressure of the plasma PM and energy of plasma particles may be adjusted by the lower RF power source 4.

The vacuum pump VP may be connected to the process space 1*h*. A vacuum pressure may be applied to the process space 1*h* by the vacuum pump VP while the process is performed on the substrate W.

The gas supply unit GS may be configured to supply a gas into the process space 1*h*. To that end, the gas supply unit GS may include a gas tank, a compressor, and a valve. A portion of the gas supplied in the process space 1*h* by the gas supply unit GS may be formed into the plasma PM.

The substrate processing apparatus SY may further include a focus ring FD. The focus ring FD may be config- ured to control the plasma PM on an edge of the substrate W. That is, a concentration, an amount, and the like of the plasma PM on the substrate W may be controlled by adjusting a height, an angle, and the like of the focus ring FD. The focus ring FD may have a ring shape. The focus ring FD may be located on the stage 7. The focus ring FD may surround the substrate W. The focus ring FD may support the substrate W.

The substrate processing apparatus SY may further include a coil and an upper power source. An insulating plate may be located on the gas injection unit 3. The coil may be located on the insulating plate. The coil may be located on the gas injection unit 3. The coil may be electrically con- nected to the upper power source. The upper power source may be configured to supply AC power to the coil. The AC power may be RF power. A relatively high concentration of the plasma PM may be generated by the coil and the upper power source even when a pressure of the process space 1*h* may be low.

The spin polarizer 9 may be configured to align spin directions of particles of the plasma PM. The spin polarizer 9 may be located in the process space 1*h*. The spin polarizer 9 may be spaced upward from the stage 7. The spin polarizer 9 may have a ring shape.

Referring to FIG. 2, the substrate processing apparatus SY may further include a driving unit 9*a*. The driving unit 9*a* may be configured to vertically move the spin polarizer 9. The driving unit 9*a* may include a motor, a rail, and/or a wire. However, the components of the driving unit 9*a* are not limited thereto. For example, the driving unit 9*a* may further include other components capable of moving the spin polar- izer 9 in a vertical direction.

Referring to FIG. 3, the stage 7 may include a chuck 71 and a cooling plate 73.

The substrate W may be disposed on the chuck 71. The chuck 71 may fix and/or hold the substrate W at a certain position. In some embodiments, the chuck 71 may include a chuck body 711, a plasma electrode 713, a chuck electrode 715, and a heater 717.

The chuck body 711 may have a cylindrical shape. The chuck body 711 may include ceramics, however, embodi- ments of the present disclosure are not limited thereto. The substrate W may be disposed on a top surface of the chuck body 711. An edge ring ER may surround the chuck body 711.

The plasma electrode 713 may be located in the chuck body 711. The plasma electrode 713 may include, but not be limited to, aluminum (Al). The plasma electrode 713 may have, but not limited to, a disc shape. AC power may be applied to the plasma electrode 713. That is, the lower RF power source 4 may apply the AC power to the plasma electrode 713. For example, the lower RF power source 4 may apply the RF power to the plasma electrode 713. The plasma PM in the process space 1*h* may be controlled by the AC power applied to the plasma electrode 713.

The chuck electrode 715 may be located in the chuck body 711. The chuck electrode 715 may be located above the plasma electrode 713. DC power may be applied to the chuck electrode 715. That is, the DC power source 2 may apply the DC power to the chuck electrode 715. The substrate W on the chuck body 711 may be fixed and/or held at a certain position by the DC power applied to the chuck electrode 715. The chuck electrode 715 may include, but not be limited to, aluminum (Al).

The heater 717 may be located in the chuck body 711. The heater 717 may be located between the chuck electrode 715 and the plasma electrode 713. The heater 717 may include a heating wire. For example, the heater 717 may include concentric heating wires. The heater 717 may be configured to emit heat to the surrounding. Consequently, the heater 717 may cause a temperature of the chuck body 711 to rise (e.g., increase).

The cooling plate 73 may be located under the chuck 71. That is, the chuck 71 may be located on the cooling plate 73. The cooling plate 73 may provide a cooling hole 73h. Cooling water may flow through the cooling hole 73h. The cooling water in the cooling hole 73h may absorb heat from the cooling plate 73.

The spin polarizer 9 may be spaced upward from the stage 7 and/or the focus ring FD. That is, the spin polarizer 9 may not be in contact with the stage 7 and/or the focus ring FD. The spin polarizer 9 may overlap with at least a portion of each of the stage 7 and the focus ring FD when viewed in a plan view. As a result, a space may be formed between the spin polarizer 9 and the stage 7 (and/or the focus ring FD).

Figure 4:
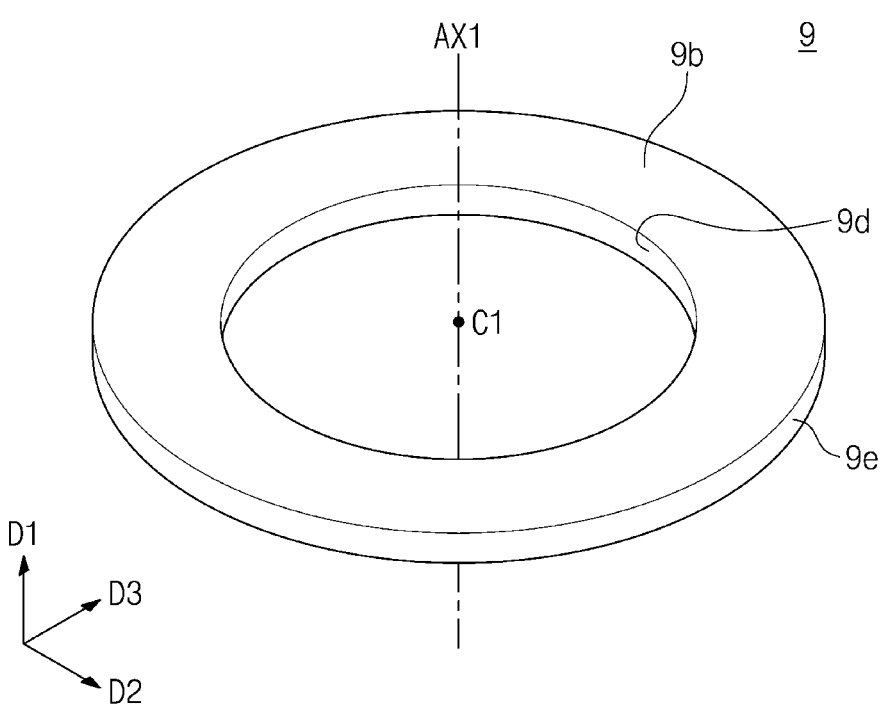
FIG. 4 is a perspective view illustrating a spin polarizer, according to some embodiments.
Figure 5:
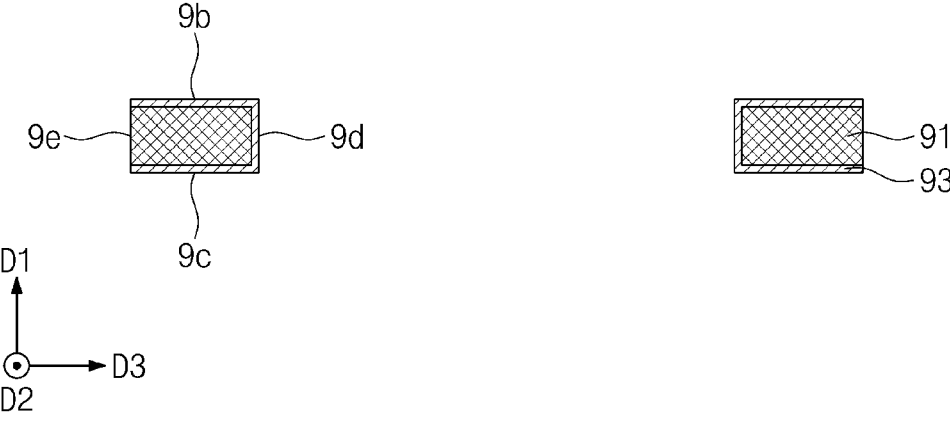
FIG. 5 is a cross-sectional view illustrating a spin polarizer, according to some embodiments.
Figure 6:
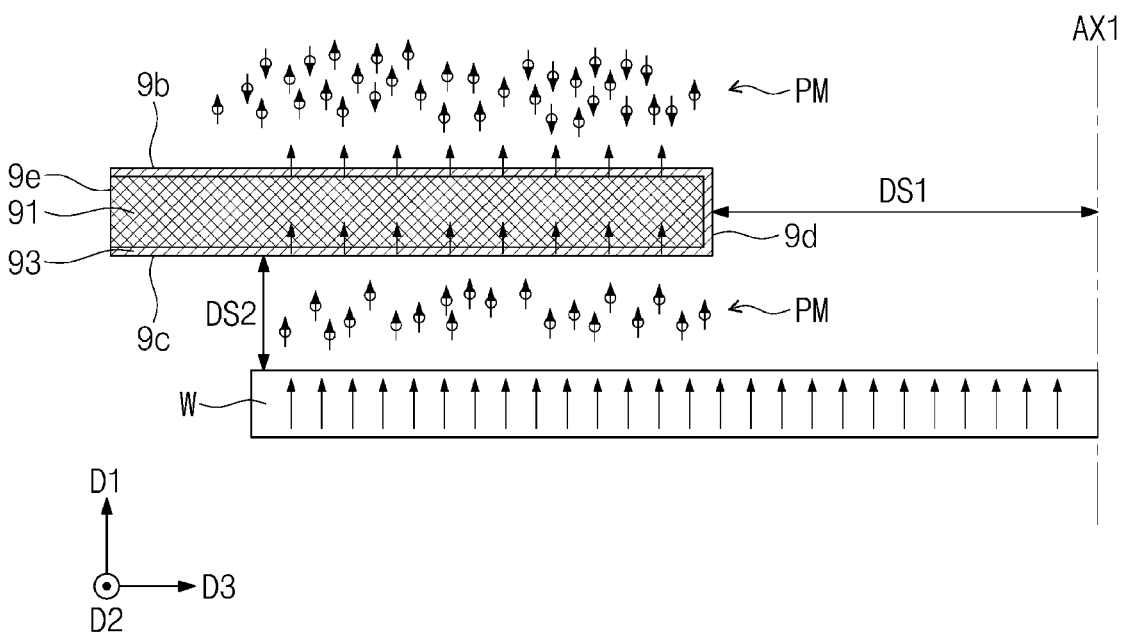
FIG. 6 is a front view illustrating a substrate and a spin polarizer, according to some embodiments.
Figure 7:
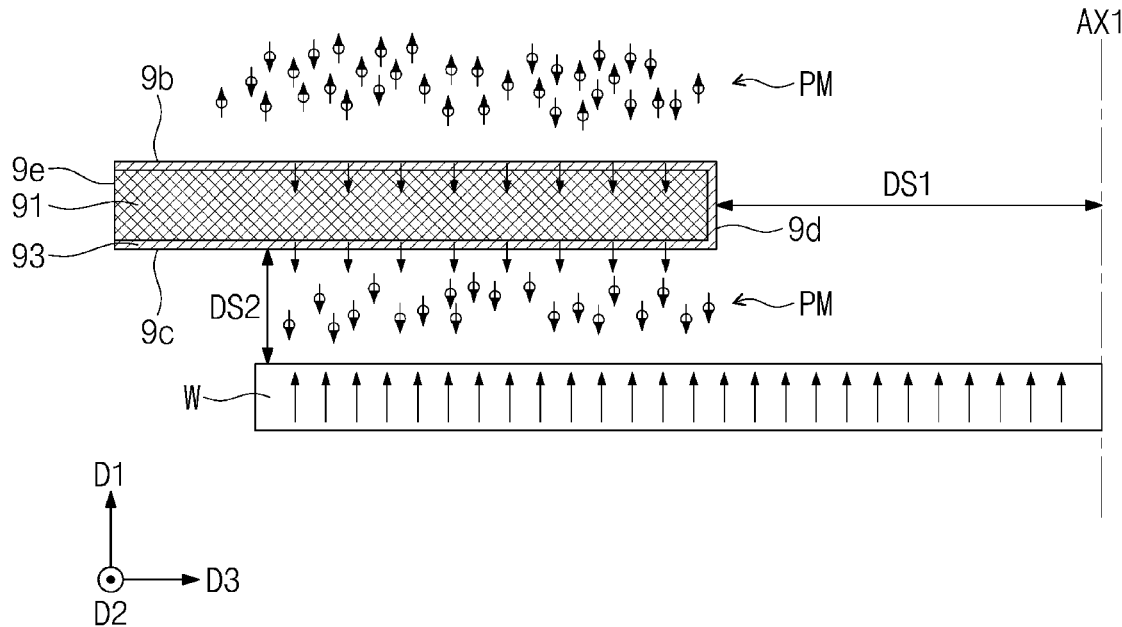
FIG. 7 is a front view illustrating a substrate and a spin polarizer, according to some embodiments.

FIG. 4 is a perspective view illustrating the spin polarizer 9, according to some embodiments. FIG. 5 is a cross-sectional view illustrating the spin polarizer 9, according to some embodiments. FIG. 6 is a front view illustrating the substrate W and the spin polarizer 9, according to some embodiments. FIG. 7 is a front view illustrating the substrate W and the spin polarizer 9, according to some embodiments.

Referring to FIGS. 4 and 5, the spin polarizer 9 may have a ring shape. The spin polarizer 9 may have an inner surface 9d, an outer surface 9e, a top surface 9b, and a bottom surface 9c. However, the shape of the spin polarizer 9 may not be limited thereto. The spin polarizer 9 may have a first center C1. The spin polarizer 9 may have a first axis AX1 passing through the first center C1. An inner diameter of the spin polarizer 9 may be a diameter of the inner surface 9d of the spin polarizer 9. The inner diameter of the spin polarizer 9 may range from about 280 millimeters (mm) to about 300 mm. However, embodiments of the present disclosure are not limited thereto.

FIG. 5 depicts a cross-sectional view of the spin polarizer 9 taken along a plane including the first axis AX1. The spin polarizer 9 may include a polarizer body 91 and a thin layer 93. The polarizer body 91 may have a ring shape. The polarizer body 91 may include, but not be limited to, a metal material. For example, the polarizer body 91 may include at least one of aluminum (Al), iron (Fe), copper (Cu), nickel (Ni), and the like. However, embodiments of the present disclosure are not limited thereto. For example, in some embodiments the polarizer body 91 may include at least one of other various metal materials and metal alloys. The outer surface 9e of the spin polarizer 9 may be in contact with an inner surface of the process chamber 1. Thus, the spin polarizer 9 may be supported by the process chamber 1. However, embodiments of the present disclosure are not limited thereto. For example, when the substrate processing apparatus SY includes the driving unit 9a, the outer surface 9e of the spin polarizer 9 may be in contact with the driving unit 9a.

The thin layer 93 may be located on a surface of the polarizer body 91. The thin layer 93 may surround the surface of the polarizer body 91. For example, the thin layer 93 may surround at least one of a top surface, a bottom surface, and an inner surface of the polarizer body 91. A thickness of the thin layer 93 may range from about 20 nanometers (nm) to about 60 nm. For example, the thickness of the thin layer 93 may be about 30 nm. The thin layer 93 may include, but not be limited to, a ferromagnetic material. For example, the thin layer 93 may include, but not be limited to, at least one of iron (Fe), nickel (Ni), manganese (Mn), cobalt (Co), a cobalt-iron-boron (CoFeB) alloy, cobalt-iron (CoFe) alloy, a platinum-manganese (PtMn) alloy, and the like.

The spin polarizer 9 may be magnetized by a strong magnetic field outside the process chamber 1. The magnetized spin polarizer 9 may be provided into the process chamber 1. The thin layer 93 including the ferromagnetic material may not lose its magnetism after being magnetized.

Referring to FIGS. 6 and 7, a portion of the spin polarizer 9 and a portion of the substrate W may be provided. In FIGS. 6 and 7, the particles of the plasma PM are illustrated to be located on and under the spin polarizer 9 for ease and convenience of explanation. The particles of the plasma PM may be located outside the spin polarizer 9 in the vertical direction. The substrate W may have the first axis AX1 as a central axis. The spin polarizer 9 may have the first axis AX1 as a central axis. That is, the central axis of the substrate W may be substantially similar and/or the same as the central axis of the spin polarizer 9. A distance from the first axis AX1 to the inner surface 9d of the spin polarizer 9 may be referred to as a first horizontal distance DS1. The first horizontal distance DS1 may range from about 140 mm to about 150 mm. The shortest distance in a horizontal direction between the inner surface 9d of the spin polarizer 9 and an edge of the stage 7 may be referred to as a second horizontal distance. The second horizontal distance may range from about 1 mm to about 10 mm. A distance in the vertical direction between the spin polarizer 9 and the substrate W may be referred to as a first vertical distance DS2. The first vertical distance DS2 may be a distance between a top surface of the substrate W and the bottom surface 9c of the spin polarizer 9. The first vertical distance DS2 may be changed by the driving unit 9a. For example, the driving unit 9a may move the spin polarizer 9 upward from the top surface of the stage 7 by a distance of about 1 mm to about 5 mm. Consequently, the first vertical distance DS2 may range from about 1 mm to about 5 mm. As another example, the first vertical distance DS2 may be about 2 mm. However, the range of the first vertical distance DS2 may not be limited thereto.

The substrate W may be magnetized. Consequently, spin directions of particles in the substrate W may be aligned in one direction. The spin directions of the particles in the substrate W may be the upward direction and/or the downward direction. In the present disclosure, the spin directions of the particles in the substrate W are described as the upward direction for ease and convenience of explanation. Spin directions of the particles of the plasma PM in the process space 1h may be different from each other. For example, the spin directions of the particles of the plasma PM in the process space 1h may be randomly different. Alternatively or additionally, the spin directions of the particles of the plasma PM on the spin polarizer 9 may be randomly different. The particles of the plasma PM may pass through the spin polarizer 9. The thin layer 93 of the spin polarizer 9 may be magnetized. The thin layer 93 may be magnetized outside the process chamber 1 and then may be provided into the process chamber 1. A magnetization direction of the thin layer 93 may be changed for each process. The magnetization direction of the magnetized thin layer 93 may not be changed but may be consistent. The spin directions of the particles of the plasma PM passed through the spin polarizer 9 may be aligned in a substantially similar and/or the same direction as the magnetization direction of the spin polarizer 9.

Referring to FIG. 6, the thin layer 93 may be magnetized in the upward direction. Particles of the thin layer 93 may be magnetized in the upward direction. The spin directions of the particles of the plasma PM passed through the thin layer 93 may be the upward direction. The spin directions of the particles of the plasma PM under the spin polarizer 9 may be the upward direction. When the spin directions of the particles of the plasma PM are the same as the spin directions of the particles in the substrate W, attractive force may be generated between the particles of the plasma PM and the particles in the substrate W. When the attractive force is generated between the particles of the substrate W and the particles in the plasma PM, the etching and/or deposition process of the substrate W may be more easily performed. For example, threshold energy needed to generate sputtering by the gas in the process space 1*h* may be reduced and/or minimized. For example, the threshold energy may be reduced by about 40% to about 60% by controlling the spin directions of the particles of the plasma PM, when compared to related substrate processing apparatus.

Referring to FIG. 7, the thin layer 93 may be magnetized in the downward direction. That is, the particles of the thin layer 93 may be magnetized in the downward direction. The spin directions of the particles of the plasma PM passed through the thin layer 93 may be the downward direction. The spin directions of the particles of the plasma PM under the spin polarizer 9 may be the downward direction. When the spin directions of the particles of the plasma PM are different from the spin directions of the particles in the substrate W, a repulsive force may be generated between the particles of the plasma PM and the particles in the substrate W. When the repulsive force is generated between the particles in the substrate W and the particles of the plasma PM, the etching and/or deposition process of the substrate W may not be easily performed. An etch rate may be reduced by about 15% to about 35% by controlling the spin directions of the particles of the plasma PM, when compared to related substrate processing apparatus.

Figure 8:
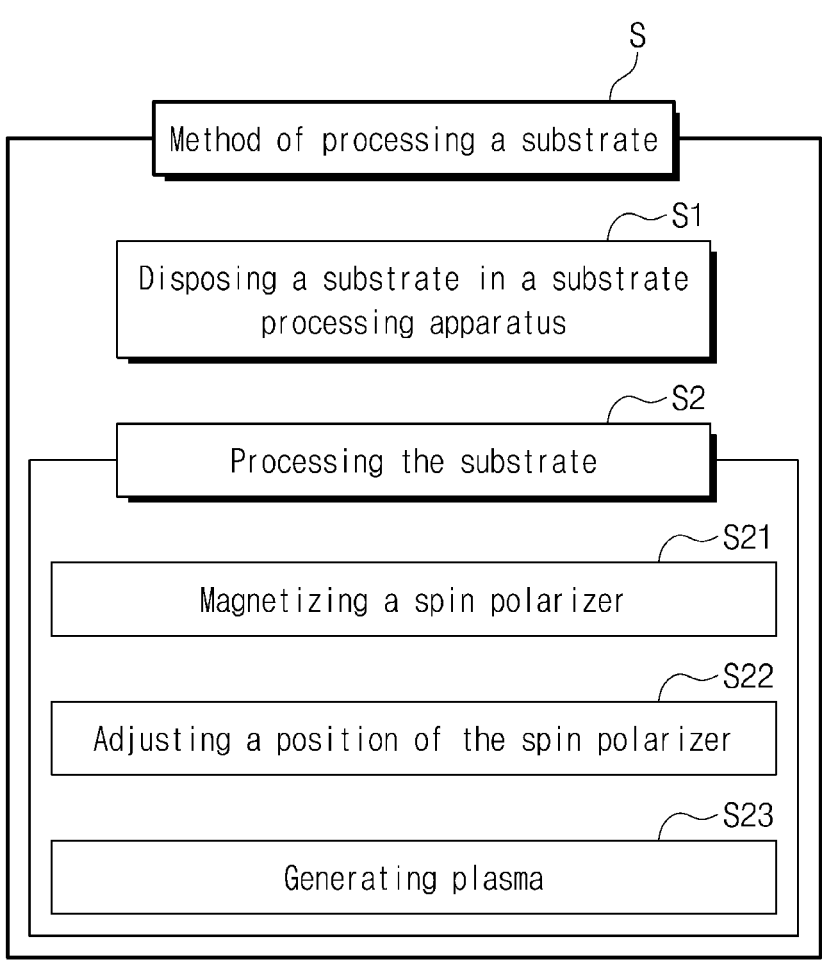
FIG. 8 is a flow chart illustrating a method of processing a substrate, according to some embodiments.

FIG. 8 is a flow chart illustrating a method of processing a substrate, according to some embodiments.

Referring to FIG. 8, a method of processing a substrate (S) may include disposing the substrate W in the substrate processing apparatus SY (operation S1) and processing the substrate W (operation S2). The processing of the substrate W (operation S2) may include magnetizing the spin polarizer 9 (operation S21), adjusting a position of the spin polarizer 9 (operation S22), and generating the plasma PM (operation S23). The magnetizing of the spin polarizer 9 (operation S21) may include magnetizing the spin polarizer 9 by a magnetic field of about 0.5 Tesla (T) to about 3 T. However, an intensity of the magnetic field for magnetizing the spin polarizer 9 may not be limited thereto. The adjusting of the position of the spin polarizer 9 (operation S22) may include operating the driving unit 9*a*. Alternatively or additionally, the position of the spin polarizer 9 may be adjusted without the driving unit 9*a*.

According to the substrate processing apparatus and the method of processing a substrate using the same in the embodiments of the present disclosure, the spin directions of the plasma particles on the substrate may be aligned in a certain direction. For example, the spin directions of the plasma particles on the edge of the substrate may be aligned. The reaction with the substrate may be adjusted by aligning the spin directions of the plasma particles. When the spin directions of the substrate particles are the same as the spin directions of the plasma particles, the substrate may react relatively easily with the plasma particles. When the spin directions of the substrate particles are different from the spin directions of the plasma particles, the substrate may not react relatively easily with the plasma particles.

According to the substrate processing apparatus and the method of processing a substrate using the same in the embodiments of the present disclosure, a spin alignment degree of the plasma particles passed through the spin polarizer may be adjusted. For example, the spin polarizer may be magnetized outside the process chamber. That is, the spin polarizer may be magnetized by an external magnetic field. A magnetization degree of the spin polarizer may be changed depending on the intensity of the magnetic field for magnetizing the spin polarizer. When the spin polarizer is strongly magnetized, the spin alignment degree of the plasma particles passed through the spin polarizer may be high. When the spin polarizer is weakly magnetized, the spin alignment degree of the plasma particles passed through the spin polarizer may be low. When the spin directions of the substrate particles are substantially similar and/or the same as the spin directions of the plasma particles and the spin alignment degree is relatively high, the substrate may react relatively strongly with the plasma particles. When the spin directions of the substrate particles are the same as the spin directions of the plasma particles and the spin alignment degree is relatively low, the substrate may react relatively weakly with the plasma particles.

According to the substrate processing apparatus and the method of processing a substrate using the same in the embodiments of the present disclosure, the first vertical distance between the spin polarizer and the substrate may be adjusted. For example, the first vertical distance may be changed. The first vertical distance may be adjusted by the driving unit, but embodiments of the present disclosure are not limited thereto. The reactivity between the substrate and the plasma particles may be adjusted by changing the first vertical distance.

According to the substrate processing apparatus and the method of processing a substrate using the same in the embodiments of the present disclosure, the spin directions of the plasma particles on the edge of the substrate may be consistently aligned.

According to the substrate processing apparatus and the method of processing a substrate using the same in the embodiments of the present disclosure, the spin directions of the plasma particles on the edge of the substrate may be changed.

According to the substrate processing apparatus and the method of processing a substrate using the same in the embodiments of the present disclosure, the reactivity between the substrate and the plasma on the edge of the substrate may be increased and/or decreased.

While the embodiments of the present disclosure have been particularly shown and described, it is to be understood by one of ordinary skill in the art that variations in form and detail may be made therein without departing from the spirit and scope of the attached claims.

What is claimed is:

1. A substrate processing apparatus, comprising:
a process chamber providing a process space;
a stage configured to support a substrate;
a gas injection unit spaced upward from the stage in the process space; and
a spin polarizer having a ring shape and spaced upward from the stage, wherein the spin polarizer comprises:

a polarizer body having a ring shape; and a thin layer on a surface of the polarizer body, and wherein the thin layer comprises a ferromagnetic material.

2. The substrate processing apparatus of claim 1, wherein the ferromagnetic material comprises at least one of a cobalt-iron-boron (CoFeB) alloy, a cobalt-iron (CoFe) alloy, and a platinum-manganese (PtMn) alloy.

3. The substrate processing apparatus of claim 1, wherein the spin polarizer comprises a first axis, and wherein a distance from the first axis to an inner surface of the spin polarizer ranges from about 140 millimeters (mm) to about 150 mm.

4. The substrate processing apparatus of claim 1, wherein the spin polarizer is spaced upward from a top surface of the stage by a distance of about 1 millimeter (mm) to about 5 mm.

5. The substrate processing apparatus of claim 1, wherein the thin layer at least partially surrounds at least one of a top surface, a bottom surface, and an inner surface of the polarizer body.

6. The substrate processing apparatus of claim 1, wherein the polarizer body comprises at least one of aluminum, iron, copper, and nickel.

7. The substrate processing apparatus of claim 1, wherein a thickness of the thin layer ranges from about 20 nanometers (nm) to about 60 nm.

8. The substrate processing apparatus of claim 1, further comprising:

a driving unit configured to vertically move the spin polarizer; and a focus ring on the stage and configured to at least partially surround the substrate.

9. A substrate processing apparatus, comprising:

a process chamber providing a process space;

a stage configured to support a substrate;

a gas injection unit spaced upward from the stage in the process space;

a radio frequency (RF) power source electrically coupled with the stage and configured to supply alternating current (AC) power to the stage; and a spin polarizer on an edge of the stage and spaced upward from the stage, wherein the spin polarizer comprises:

a polarizer body; and a thin layer at least partially surrounding at least one of an inner surface, a top surface, and a bottom surface of the polarizer body.

10. The substrate processing apparatus of claim 9, wherein the thin layer comprises a ferromagnetic material.

11. The substrate processing apparatus of claim 10, wherein the ferromagnetic material comprises at least one of iron, nickel, manganese, cobalt, a cobalt-iron-boron (CoFeB) alloy, a cobalt-iron (CoFe) alloy, and a platinum-manganese (PtMn) alloy.

12. The substrate processing apparatus of claim 9, wherein a thickness of the thin layer ranges from about 20 nanometers (nm) to about 60 nm.

13. The substrate processing apparatus of claim 9, further comprising:

a driving unit configured to vertically move the spin polarizer, wherein the driving unit is further configured to move the spin polarizer upward from a top surface of the stage by a distance of about 1 millimeter (mm) to about 5 mm.

14. The substrate processing apparatus of claim 9, wherein a shortest distance in a horizontal direction between an inner surface of the spin polarizer and the edge of the stage ranges from about 1 millimeter (mm) to about 10 mm.

15. The substrate processing apparatus of claim 9, wherein an outer surface of the polarizer body is in contact with an inner surface of the process chamber, and wherein the process chamber is configured to support the spin polarizer.

16. The substrate processing apparatus of claim 9, wherein the polarizer body comprises at least one of iron, copper, and aluminum.

\* \* \* \* \*